(12) United States Patent
Cano et al.

(10) Patent No.: US 7,365,556 B2
(45) Date of Patent: Apr. 29, 2008

(54) SEMICONDUCTOR DEVICE TESTING

(75) Inventors: Francisco Cano, Missouri City, TX (US); Juan C. Martinez, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 11/218,650

(22) Filed: Sep. 2, 2005

(65) Prior Publication Data

US 2006/0044001 A1    Mar. 2, 2006

Related U.S. Application Data

(60) Provisional application No. 60/606,600, filed on Sep. 2, 2004.

(51) Int. Cl.
    *G01R 31/26*      (2006.01)
(52) U.S. Cl. .................................. 324/765
(58) Field of Classification Search ............... None
See application file for complete search history.

(56) References Cited

U.S. PATENT DOCUMENTS

| | | | | |
|---|---|---|---|---|
| 4,961,053 A | * | 10/1990 | Krug | 324/537 |
| 5,053,700 A | * | 10/1991 | Parrish | 324/537 |
| 5,285,082 A | | 2/1994 | Axer | |
| 5,389,556 A | * | 2/1995 | Rostoker et al. | 438/17 |
| 5,811,983 A | | 9/1998 | Lundberg | |
| 5,881,067 A | | 3/1999 | Narayanan et al. | |
| 6,680,484 B1 | | 1/2004 | Young | |
| 6,784,685 B2 | | 8/2004 | Chao et al. | |
| 6,943,577 B2 | * | 9/2005 | Shin et al. | 324/765 |
| 2002/0078409 A1 | | 6/2002 | Marshall et al. | |
| 2004/0257105 A1 | | 12/2004 | Chao et al. | |

OTHER PUBLICATIONS

"CMOS Oscillators," Application Note 118, Oct. 1974, www.fairchildsemi.com/an/AN/AN-118.pdf.

* cited by examiner

*Primary Examiner*—Ha Tran Nguyen
*Assistant Examiner*—Trung Q. Nguyen
(74) *Attorney, Agent, or Firm*—Robert D. Marshall, Jr.; W. James Brady; Frederick J. Telecky, Jr.

(57) ABSTRACT

An apparatus and method to test components in a semiconductor test structure. On a semiconductor wafer, a test module implemented in one or more scribe lines between a plurality of semiconductor dies is used to test components in the semiconductor test structure. The test module may, for example, test electrical characteristics of chains of vias, transistors, and functional devices, such as oscillators. The test module contains a scan chain control coupled through a plurality of pass gates to each component to be tested. The scan chain control sequentially closes the pass gates to separately test the components in the semiconductor test structure. The test module further interfaces with an external testing device and the results of each test are compared with the expected results to identify faulty components.

4 Claims, 7 Drawing Sheets

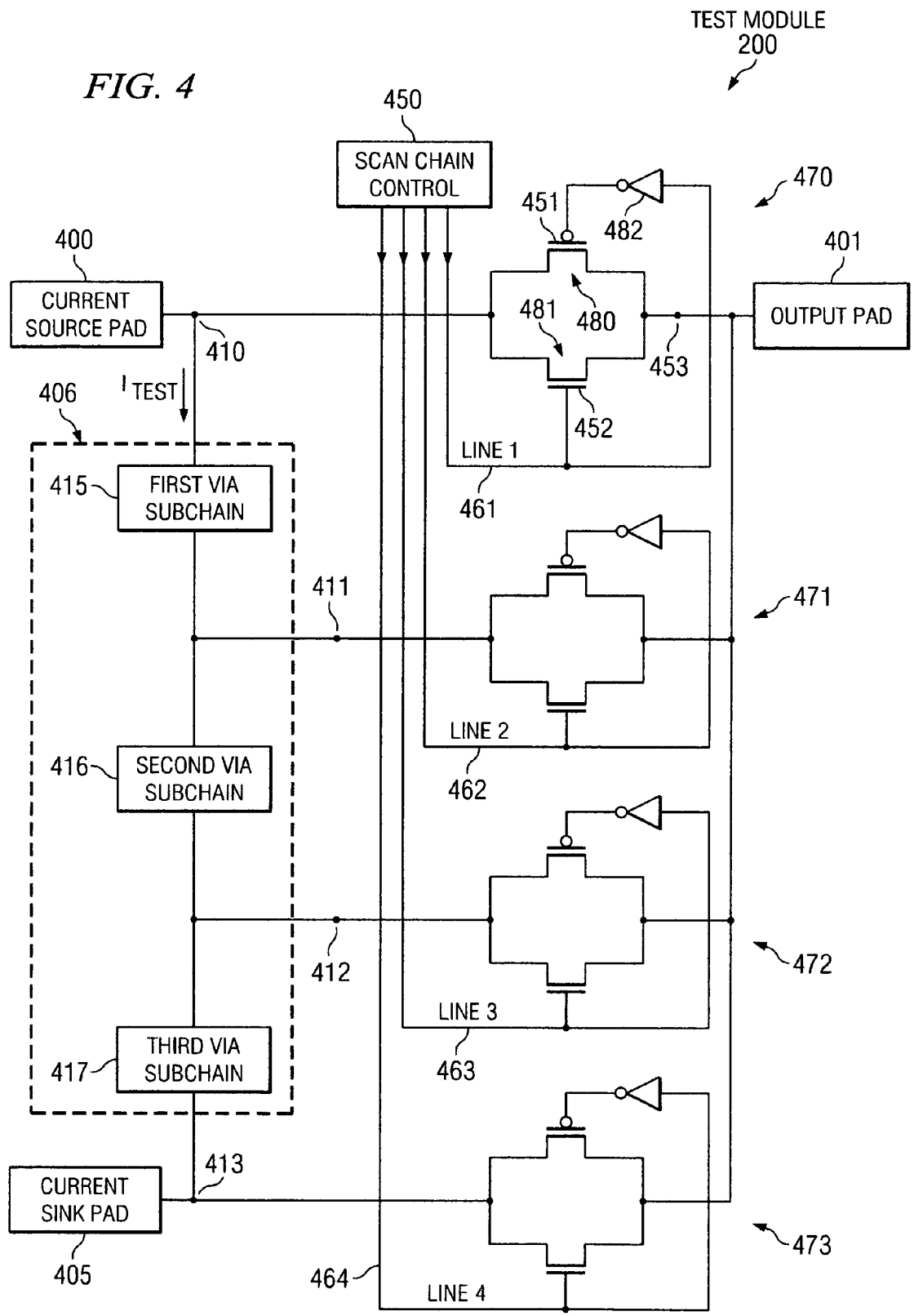

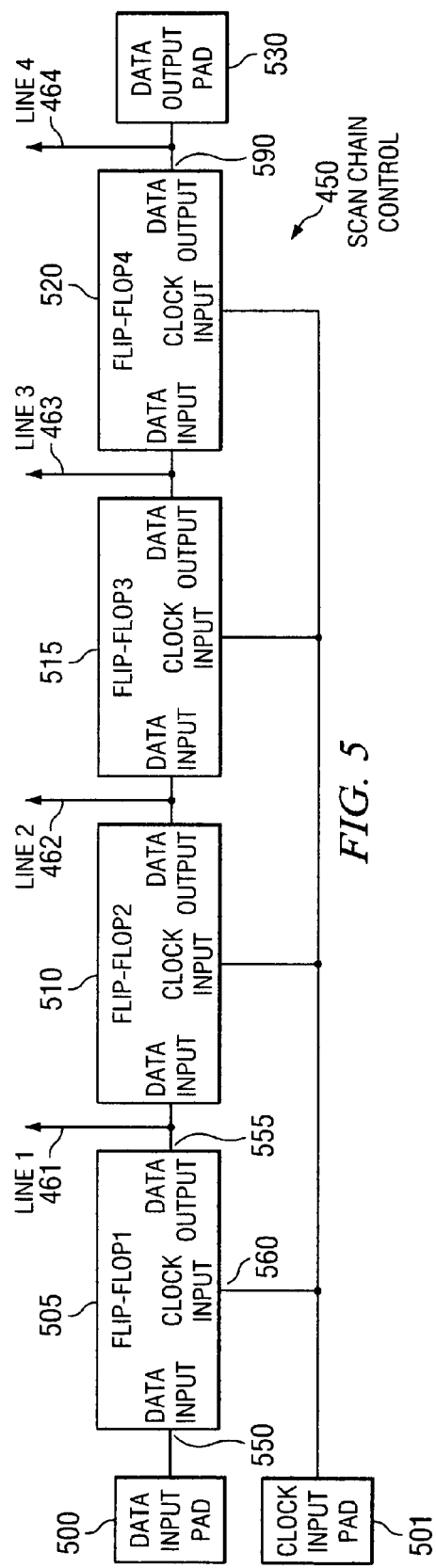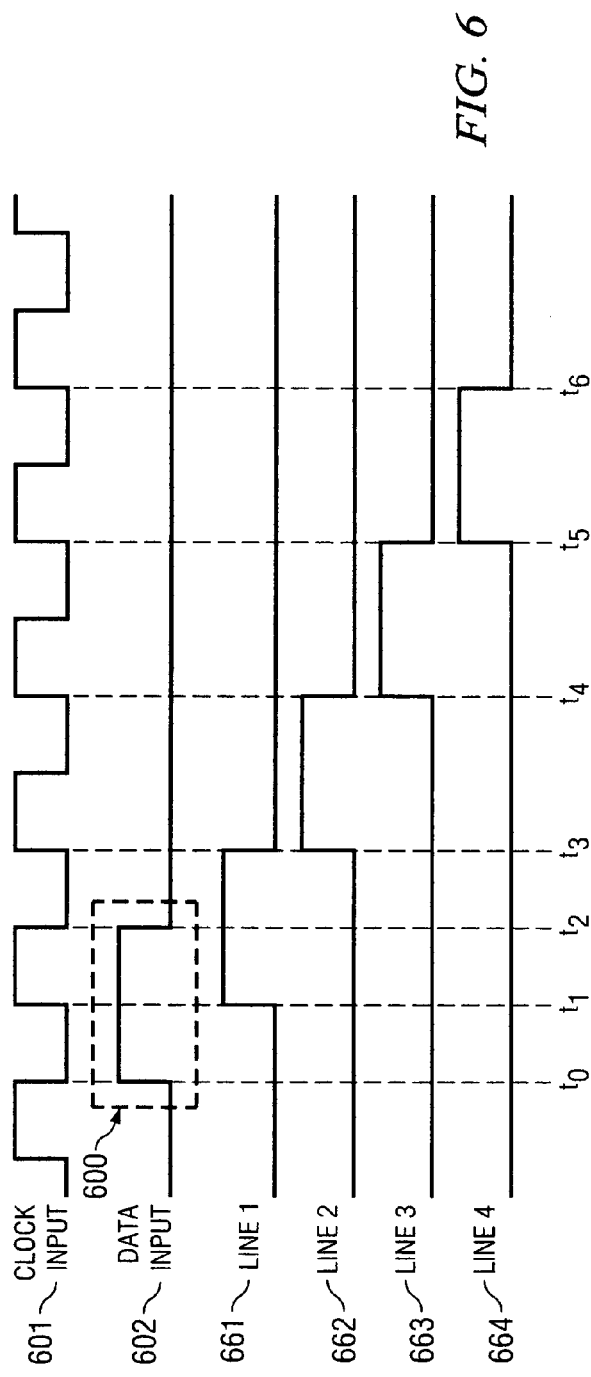
FIG. 5
FIG. 6

SEMICONDUCTOR DEVICE TESTING

This application claims priority under 35 USC §119(e)(1) of Provisional Application No. 60/606,600, filed Sep. 2, 2004.

CROSS REFERENCE TO RELATED APPLICATIONS

This application is related to the following co-pending application: U.S. patent application Ser. No. 11/218,458 entitled "APPARATUS AND METHOD FOR TESTING CHAINS OF VIAS AND CONTACTS" filed Sep. 2, 2005, incorporated herein by reference.

TECHNICAL FIELD OF THE INVENTION

The present invention generally relates to testing of an electronic device. More particularly, the present invention relates to testing components in a semiconductor device. Still more particularly, the present invention relates to using active devices to test components in a semiconductor device.

BACKGROUND OF THE INVENTION

An integrated circuit (IC) is a semiconductor device containing many small, interconnected components such as diodes, transistors, resistors, and capacitors. These components function together to enable the IC to perform a task, such as control an electronic device or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. The connections between the layers are known as vias. A via is a metal interconnect coupled between two planar conductive layers in a semiconductor die. Multiple vias may be coupled together in what may be referred to as a "via chain" connecting one conductive region in an IC to another conductive region.

A manufacturing error in one of the components mentioned above may render an IC or semiconductor device incapable of functioning properly. For example, consider a memory device containing several ICs. If a transistor within one of the ICs fails to function properly, the memory device may produce memory errors. Vias are also subject to manufacturing errors. When a manufacturing error occurs in a via, the via may not conduct properly and thus may prohibit an IC from functioning correctly. For instance, an open via or a partially open via may prohibit a device from functioning as designed. An open via may have a high or infinite resistance, and a partially open via may have a higher than average resistance.

Vias in a semiconductor device may be tested by measuring the resistance of via test chains. This technique identifies via chains containing open vias and some partially open vias by their high resistance. A problem with this approach is that tests may fail to identify via chains containing vias that have slightly larger than expected resistances. Consider a via chain in which each via has an expected resistance. For example, a via may have an average resistance of between eight and twelve ohms. Thus, a via chain having one thousand vias has an expected resistance of between eight thousand and twelve thousand ohms. However, one via in the via chain could have a resistance of one thousand ohms, while the other vias have an average resistance of nine ohms. Thus, the resistance of the entire via chain is approximately ten thousand ohms. Even though one via is a partially open via, the resistance of the entire via chain may still fall within the expected resistance range. As a result, measuring the resistance of the entire via chain may fail to identify one or more vias with a higher than average resistance in the via chain.

Circuitry to test IC components on a semiconductor device, such as resistors, transistors, vias, and oscillators, may interface with an external testing device. While the test circuitry may test vias and other semiconductor device components so that flawed components may be identified, the test circuitry may take up space on or around the semiconductor device that may otherwise be used to fabricate more IC components. Thus, an apparatus and method that both accurately tests semiconductor devices and takes up little space on or around the semiconductor die would be beneficial.

SUMMARY OF THE INVENTION

The problems noted above are solved by sequentially testing a plurality of components-under-test (CUT) using a scan chain control. In some embodiments of the invention, a current is sent through the plurality of CUT. A plurality of electrical characteristics of the CUT are measured to determine if the CUT are correctly functioning. The electrical characteristics may be a voltage or a current. The plurality of CUT may be coupled to a plurality of pass gates. Each of the CUT may be a resistive element or a via chain. The via chain may comprise a plurality of vias coupled in series.

A control that may be the scan chain control couples to the plurality of pass gates. The control is capable of closing and opening the pass gates to allow determination of a voltage across each of the CUT. The control may sequentially close and open each pass gate to allow determination of the voltage across each of the CUT. The voltage across each of the CUT may be compared with an expected voltage.

A source pad and a sink pad couple to the plurality of CUT. An output pad couples to the plurality of pass gates. The voltage across each of the CUT is determined at the output pad. A testing device may couple to the source pad, sink pad, and output pad. The testing device is capable of providing a current to the source pad and a connection to ground to the sink pad. The testing device is further capable of measuring the voltage across each of the CUT at the output pad.

The CUT may be located on one or more of a plurality of semiconductor dies on a semiconductor wafer. The semiconductor dies may be separated by a plurality of scribe lines on the semiconductor wafer. In some other embodiments, the CUT, pass gates, and the control may be on one or more of the plurality of scribe lines.

In some embodiments of the invention, each of a plurality of CUT couples to one of a plurality of transmission switches. Each of the CUT may be a transistor, such as a p-channel field effect transistor (PFET) or an n-channel field effect transistor (NFET). The CUT couple in parallel between a source pad and a sink pad. A current from the source pad is sent through the plurality of CUT one CUT at a time. Current is received from one of the CUT by the sink pad. A control coupled to the plurality of transmission switches is capable of sequentially closing and opening the transmission switches to determine and characterize a current-voltage relationship of each of the CUT. The current-voltage relationship from each of the CUT may be compared with an expected current-voltage relationship for each of the CUT.

An input pad couples to the plurality of transmission switches. A testing device may couple to the input pad, source pad, sink pad, and control. The testing device is capable of providing current to the source pad and receiving current from the sink pad. The testing device is also capable of transmitting the signal to the input pad. The testing device further measures the current flowing through each of the CUT at the sink pad.

Each transmission switch may further comprise a pass gate. The pass gate further comprises an input, an enable input, and an output. The input receives a signal from the input pad, and the enable input receives an enable signal from the control. Each transmission gate may further include a disable transistor. The disable transistor may include a gate connection, source connection, and drain connection. The gate connection couples to the enable input, the drain connection couples to the output, and a voltage source input couples to the source connection. The output is coupled to one of the CUT. The output sends the signal from the input to the CUT when the enable input receives an enable signal from the control. As described above, the CUT may be a transistor. The CUT transistor comprises a source connection, a gate connection coupled to the output of the transmission switch, and a drain connection coupled to the sink pad.

The voltage source input may receive a logic high or logic low signal. The disable transistor switches to a closed state to pass the logic high or logic low signal to the output when the enable input receives a disable signal from the control. The disable transistor may be a PFET or an NFET.

In some other embodiments of the invention, a plurality of CUT couples in parallel between a source pad and a ground pad. The source pad applies a voltage to the CUT and the ground pad provides a ground to the CUT. Each of the CUT is an oscillator. The oscillator further comprises an input coupled to a plurality of inverting logic. A divider couples to one of the plurality of inverting logic. The divider is capable of receiving a signal from one of the plurality of inverting logic and reducing frequency of the signal. An output couples to the divider.

As described above, a voltage is applied to the CUT and at least one electrical characteristic of the CUT is measured one CUT at a time. A control that may be a scan chain control coupled to each of the plurality of CUT is capable of providing an input signal to test each CUT to determine if the output of each of the CUT matches an expected output for each CUT, thus determining if the CUT are correctly functioning. A multiplexer couples to each CUT. The multiplexer receives an output signal from each CUT. A divider may couple to the multiplexer. The divider may be capable of reducing the frequency of the signal from the multiplexer.

BRIEF DESCRIPTION OF THE DRAWINGS

FIG. 4, in accordance with some embodiments of the invention, shows a test module capable of testing via chains;

FIG. 5, in accordance with some embodiments of the invention, shows a scan chain control within the test module;

FIG. 6 shows a sample input and output of the scan chain control illustrated in FIG. 5;

NOTATION AND NOMENCLATURE

Certain terms are used throughout the following description and claims to refer to particular system components and configurations. As one skilled in the art will appreciate, the companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the terms "couple," "couples," or "coupling" are intended to mean either an indirect or direct electrical connection. Thus, if a first device couples to a second device, that connection may be through a direct electrical connection or though an indirect electrical connection through other devices and connections.

DETAILED DESCRIPTION OF THE EMBODIMENTS

A semiconductor wafer is a slice of semiconductor material that is divided into small sections known as dies. Semiconductor devices, such as logic gates, are fabricated onto the dies. These devices consist of diodes, transistors, resistors, and capacitors that operate to perform a designed function once the dies are separated from the wafer.

In a semiconductor wafer, a test module tests vias, transistors, and logic gates, such as oscillators, in semiconductor test structures that are semiconductor devices on a semiconductor die or in a scribe line surrounding the semiconductor die. In some embodiments, the semiconductor test structures may be semiconductor devices fabricated to validate the process for manufacturing integrated circuits. In some other embodiments of the invention, the semiconductor test structure may be semiconductor devices on the die that are part of a functional integrated circuit, such as a digital signal processor (DSP), memory device, transmitter/receiver device, and so on.

The test module may be located on the semiconductor die or in the scribe line surrounding the semiconductor die. The test module tests components in semiconductor test structures on the semiconductor die or the scribe line; thus, resistors, transistors, vias, and functional devices, such as oscillators, may be tested by the test module. The test module interfaces with an external test device and sequentially tests the components on the semiconductor test structure using a scan chain control and a plurality of pass gates.

Figure 1:
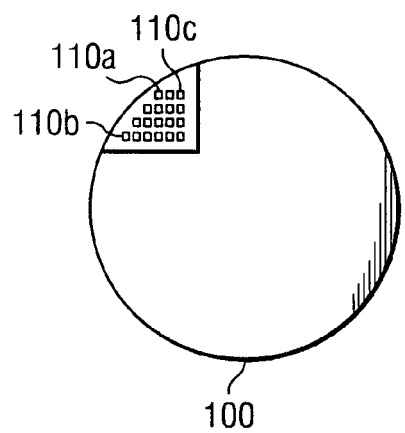
FIG. 1 shows a semiconductor wafer containing multiple semiconductor dies.
Figure 2:
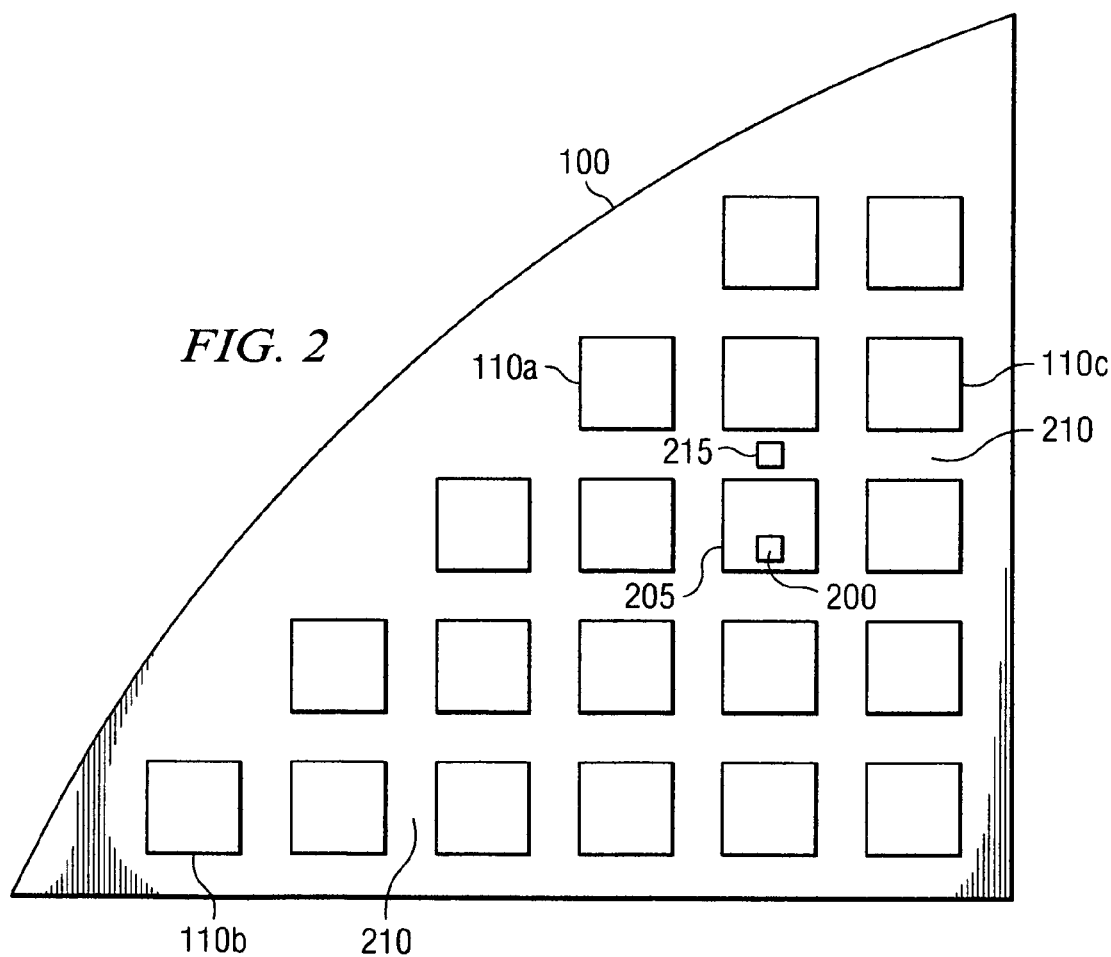
FIG. 2 shows a portion of the semiconductor wafer shown in FIG. 1.

Referring to FIG. 1, a semiconductor wafer 100 contains several semiconductor dies 110a, 110b, and 110c. FIG. 2 shows an enlarged portion of semiconductor wafer 100. Semiconductor dies 110 include semiconductor devices that may contain layers of components, such as resistors, capacitors, transistors, diodes, and vias. A plurality of scribe lines 210 separate the semiconductor dies 110. The scribe lines 210 represent areas where semiconductor wafer 100 will be cut to separate individual semiconductor dies when the fabrication process is complete.

Figure 3A:
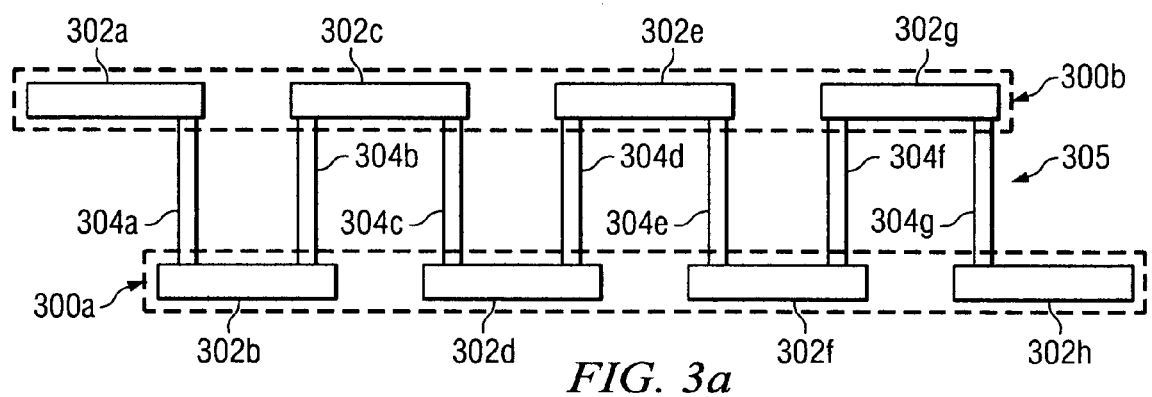
FIG. 3a shows a via chain configured between two different planar levels in a semiconductor die.

As described above, semiconductor test structures in semiconductor dies 110 or scribe line 210 contain a plurality of vias. Vias may be connected together to form a via chain. The via chain connects layers of components in the semiconductor test structure. Referring to FIG. 3a, a cross-sectional view is shown of the via chain located in a semiconductor test structure. The via chain connects layer 300a to 300b. Each layer 300 contains a plurality of conductive plates 302a-302h. Each plate 302a-302h couples to at least one other plate 302a-302h by one of the vias 304a-304g. Thus, for example, plate 302a couples to plate 302b through via 304a. Plates 302a-302h may be formed from any conductive material or combination of conductive materials including, for example, copper, aluminum, tungsten, and/or doped polysilicon. Plates 302 may also contain one or multiple layers. An isolating layer 305, which may be composed of silicon dioxide, may isolate plates 302a-302a.

Figure 3B:
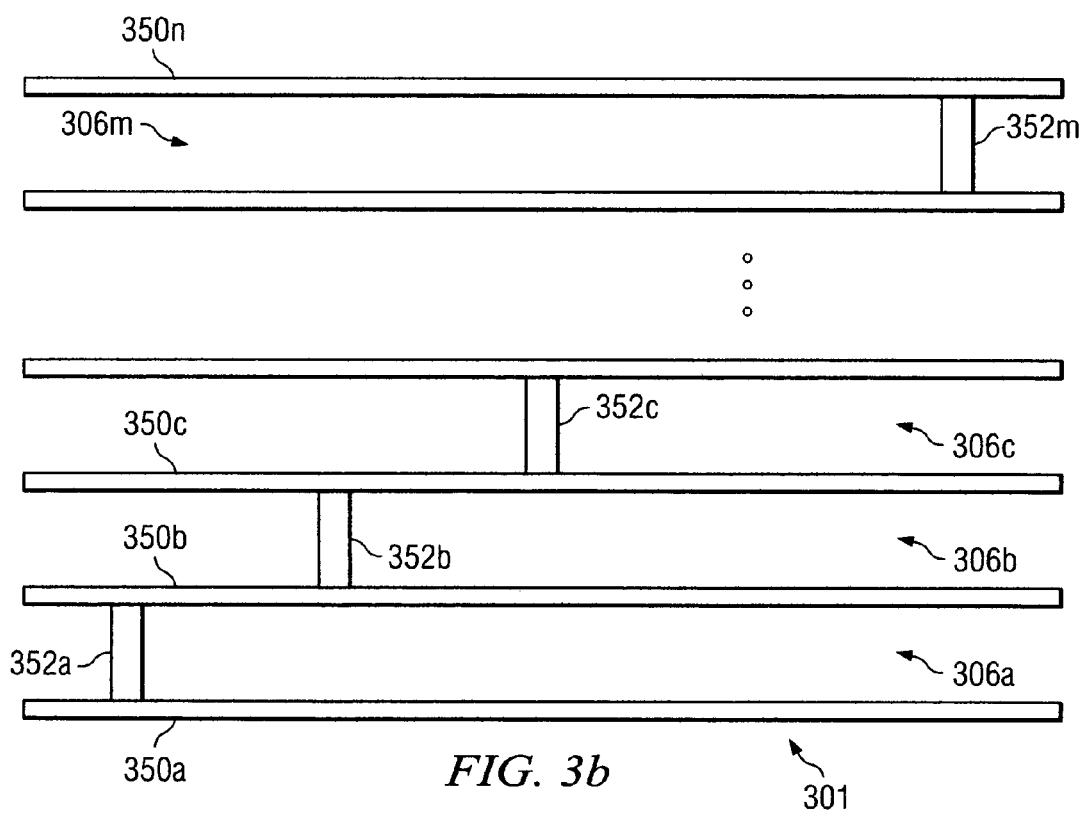
FIG. 3b shows a via chain configured between multiple planar levels in a semiconductor die.

In some embodiments of the invention, via chain 301 shown in FIG. 3b may be located in a semiconductor test structure on semiconductor die 110 or in scribe line 210. Via chain 301 includes a plurality of layers 350a . . . 350n. Each layer 350a . . . 350n is coupled to at least one other layer 350a . . . 350n by one of the vias 352a . . . 352m. Layers 350a . . . 350n may be formed from any conductive material or combination of conductive materials, such as copper, aluminum, tungsten, and/or doped polysilicon. A number of isolating layers 306a-306m, which may be composed of silicon dioxide, may isolate layers 350a . . . 350n.

In some other embodiments of the invention, each layer 350a . . . 350n in via chain 301 may consist of a plurality of conductive plates (not shown in FIG. 3b) similar to layers 300a or 300b in FIG. 3a. The plurality of conductive plates (not shown in FIG. 3b) in each layer 350a . . . 350n may connect to other layers 350a . . . 350n through vias not shown in FIG. 3b.

Returning to FIG. 2, a test module 200 is fabricated on semiconductor die 205. Test module 200 may test the functionality of semiconductor test devices on wafer 100. In some embodiments of the invention, a test module 215 may also be placed in scribe line 210. By placing the test module in scribe line 210 instead of on semiconductor die 205, more components, such as resistors, transistors, diodes, and capacitors, may be fabricated on semiconductor die 205 (not shown in FIG. 2). In accordance with some embodiments of the invention, multiple test modules may be coupled in scribe line 210 or on semiconductor die 205. Test modules may also be coupled in multiple scribe lines 210.

As described above, semiconductor test structures on semiconductor die 205 or scribe line 210 contain a plurality of vias coupled together in long chains described as via chains. A test point is a contact point that couples test module 200 to a via chain. In some embodiments of the invention, test module 200 couples to a via chain through multiple test points. Test module 200 determines the resistance of sections of the via chain between any two test points. Each section of the via chain between any two test points may be designated a via subchain. Thus, test module 200 may determine the resistance of each via subchain. As the number of vias in a via subchain decreases, more vias with above average resistances may be identified. Therefore, it is desirable for test module 200 to utilize as many test points as possible along the via chain.

Referring to FIG. 4, test module 200 tests via chains for vias with high resistances. Test module 200 couples to a via chain 406. The via chain 406 is divided into a first via subchain 415, second via subchain 416, and third via subchain 417. The via subchains are connected in series between a current source pad 400 and a current sink pad 405. First via subchain 415 connects to current source pad 400 through test point 410 and second via subchain 416 through test point 411. Third via subchain 417 connects to second via subchain 416 through test point 412 and current sink pad 405 through test point 413.

Test point 410 couples to an output pad 401 through a first pass gate 470. Output pad 401 connects to test point 411 through a second pass gate 471, test point 412 through a third pass gate 472, and test point 413 through a fourth pass gate 473. A scan chain control 450 couples to each pass gate through separate lines.

Current source pad 400, current sink pad 405, and output pad 401 are conductive contacts capable of interfacing with an external testing device (not shown), such as a probe device. The external test device may pass a test current through current source pad 400 to current sink pad 405 through first via subchain 415, second via subchain 416, and third via subchain 417. The external testing device may provide a ground connection to current sink pad 405 (not shown in FIG. 4) in order to facilitate current flow through the via chain 406. Scan chain control 450 sequentially and individually closes each pass gate. When each pass gate is closed, the pass gate connects one of the test points to output pad 401. Thus, the voltage across the via subchain(s) in between the test point connected to output pad 401 and a constant voltage reference, such as current source pad 400 or current sink pad 405, may be measured by an external testing device coupled to test module 200.

As described above, scan chain control 450 sequentially and individually closes each pass gate, and the external testing device measures the voltage across via subchain(s) between each test point and a constant voltage reference. The voltage across each via subchain is recorded by an electronic test device, such as a computer or embedded controller, coupled to the external testing device. The resistance (R) for each via subchain may be calculated using the voltage across the via subchain (ΔV) and the test current ($I_{test}$) through the via subchain. Ohm's law states:

$$R = \frac{\Delta V}{I_{test}} \qquad \text{Equation 1}$$

Thus, for example, the voltage (ΔV) across the first via subchain 415 is the difference between the voltage at test point 410 and the voltage at test point 411. Thus, the resistance of the via subchain may be calculated using Equation 1 and stored in the electronic test device. If the resistance of the via subchain is outside of an expected distribution, which indicates that the via subchain contains one or more vias with high resistance values, the semiconductor test structure may be marked as flawed. Via subchains containing low resistance values may also be identified.

In accordance with some embodiments of the invention, the via chain 406 shown in FIG. 4 may be divided into more or less than three via subchains. For example, the via chain 406 may be divided into 2, 10, 20, or more via subchains. The number of pass gates corresponds to the number of test points along the via chain. Further, multiple input pads similar to current source pad 400 and current sink pad 405 may also couple to via chain 406.

Turning now to FIG. 5, in accordance with some embodiments of the invention, scan chain control 450 is shown in more detail. Scan chain control 450 contains a first flip-flop 505, second flip-flop 510, third flip-flop 515, and fourth flip-flop 520 coupled together in series between a data input pad 500 and a data output pad 530. Each flip-flop contains a data input connection, a data output connection, and a clock input. The data input connection of each flip-flop connects to the data output connection of the previous flip-flop with the exception of first flip-flop 505. The data input connection 550 of first flip-flop 505 connects to data input pad 500. The data output connection 590 of the fourth flip-flop 520 connects to data output pad 530. A clock input pad 501 connects to the clock input of each flip-flop.

Data input pad 500, data output pad 530, and clock input pad 501 are capable of interfacing with the external testing device (not shown), such as a probe device. The external testing device may transmit a data input signal through data input pad 500 to the data input connection 550 of first flip-flop 505. Data output pad 530 may also couple to the external testing device and may transmit information from the data output connection 590 of fourth flip-flop 520 to the external testing device. Further, the external testing device may connect to clock input pad 501 and transmit a clock signal to each flip-flop. In some embodiments of the invention, circuitry connected between clock input pad 501 and the clock input connection of each flip-flop (not shown) may ensure a proper clock signal to each flip-flop.

The data output connection of each flip-flop further connects to the pass gates in test module 200 in FIG. 4. Thus, the output of each flip-flop is transmitted to one of the pass gates. For example, line one 461 connects the data output connection 555 of first flip-flop 505 to first pass gate 470. Thus, data output connection 555 transmits the output of first flip-flop 505 to first pass gate 470 through line one 461.

As described above, the external testing device connects to data input pad 500, clock input pad 501, and data output pad 530 of scan chain control 450 and further to current source pad 400, current sink pad 405, and output pad 401 of test module 200. When the external testing device allows test current through the via chain 406 in FIG. 4, the external testing device also generates a data input signal through data input pad 500 to the data input connection 550 of first flip-flop 505. First flip-flop 505 outputs the data input signal through data output connection 555 at the next rising edge of the clock signal received through the clock input 560. The remaining flip-flops receive the data input signal from the previous flip-flop and pass the data input signal through their respective data output connections at the next rising edge of the clock signal.

Referring to FIG. 6, a timing diagram for scan chain control 450 shows the clock input 601, data input 602, line one 661, line two 662, line three 663, and line four 664. As described above, the external testing device passes a clock signal through clock input pad 501. The clock signal is a periodic square wave signal to synchronize operation of scan chain control 450. The external testing device also passes a data input signal 600 through data input pad 500 at time to. In accordance with some embodiments of the invention, as shown in FIG. 6, data input signal 600 from $t_0$ to $t_2$ is logical high for one cycle of clock input 601. However, data input signal from $t_0$ to $t_2$ 600 may be any signal capable of activating the pass gates in test module 200. Thus, in some other embodiments of the invention, data input signal 600 may be logically low for activating pass gates. Additionally, data input signal 600 may last for more than one clock cycle.

First flip-flop 505 receives data input signal 600 from time $t_0$ to $t_2$ and outputs the data input signal for one clock cycle at the rising edge of clock input at time $t_1$. Thus, the data input signal is passed from data output connection 555 through line one 461 to first pass gate 470 from time $t_1$ to $t_3$. First pass gate 470 may be configured to close and connect test point 410 to output pad 401 when a logical high is received. Thus, scan chain control 450 may close first pass gate 470 when the data input signal is output from first flip-flop 505. First pass gate 470 is opened at time $t_3$ when the signal transmitted through line one returns to a logical low.

Second flip-flop 510 receives the data input signal from first flip-flop 505 from time $t_1$ to $t_3$. Second flip-flop 510 transmits the data input signal to third flip-flop 515 from time $t_3$ to $t_4$. Second flip-flop 510 also transmits the data input signal to second pass gate 471 from time $t_3$ to $t_4$. Thus, scan chain control 450 closes second pass gate 471 after first pass gate 470 is in an open state, connecting test point 411 to output pad 401. Scan chain control 450 places second pass gate 471 into an open state at time $t_4$ when a logical low signal is transmitted through line two 462.

Third pass gate 472 and fourth pass gate 473 are closed and opened in a similar order through line 3 463 and line 4 464, respectively. As shown in FIG. 6, from time $t_5$ to $t_6$, fourth flip-flop 520 transmits the data input signal to fourth pass gate 473 and data output pad 530. Fourth pass gate 473 closes when the data input signal is received through line 464. Data output pad 530 also couples to the external testing device. The external testing device may compare the data input signal from fourth flip-flop 520 to the original data input signal 600 in order to verify proper operation of the scan chain control 450.

In accordance with some embodiments of the invention, scan chain control 450 may contain more or less than four flip-flops. For example, scan chain control 450 may contain nine flip-flops if test module 200 contains nine pass gates. Thus, scan chain control 450 may also consists of nine lines connecting scan chain control 450 to the nine pass gates.

Returning to FIG. 4, pass gate 470 in test module 200 consists of a p-channel field effect transistor (PFET) 480, n-channel field effect transistor (NFET) 481, and an inverter 482. PFET 480 functions as an open switch when a voltage representing a logical high is applied to gate connection 451 of the PFET. PFET 480 functions as a closed switch when a voltage representing a logical low is applied to the gate connection 451 of the PFET. Conversely, NFET 481 functions as an open switch when a voltage representing a logical low is applied to gate connection 452 of the NFET, and NFET 481 functions as a closed switch when a voltage representing a logical high is applied to the gate connection 452 of the NFET. Inverter 482 provides an output that is the inverse of the input. Thus, if a logical high is passed to the inverter, the inverter outputs a logical low and vice versa.

For first pass gate 470, the drain connection of PFET 480 connects to the drain connection of NFET 481 at test point 410. The source connection of PFET 480 connects to the source connection of NFET 481 at junction 453. Junction 453 further connects to output pad 401. Scan chain control 450 connects to the gate connection of NFET 481 gate through line one 461. Scan chain control 450 also connects to the gate connection of PFET 480 through line one 461 and further through inverter 482. Inverter 482 inverts the signal transmitted to the gate connection of PFET 480.

Figure 7:
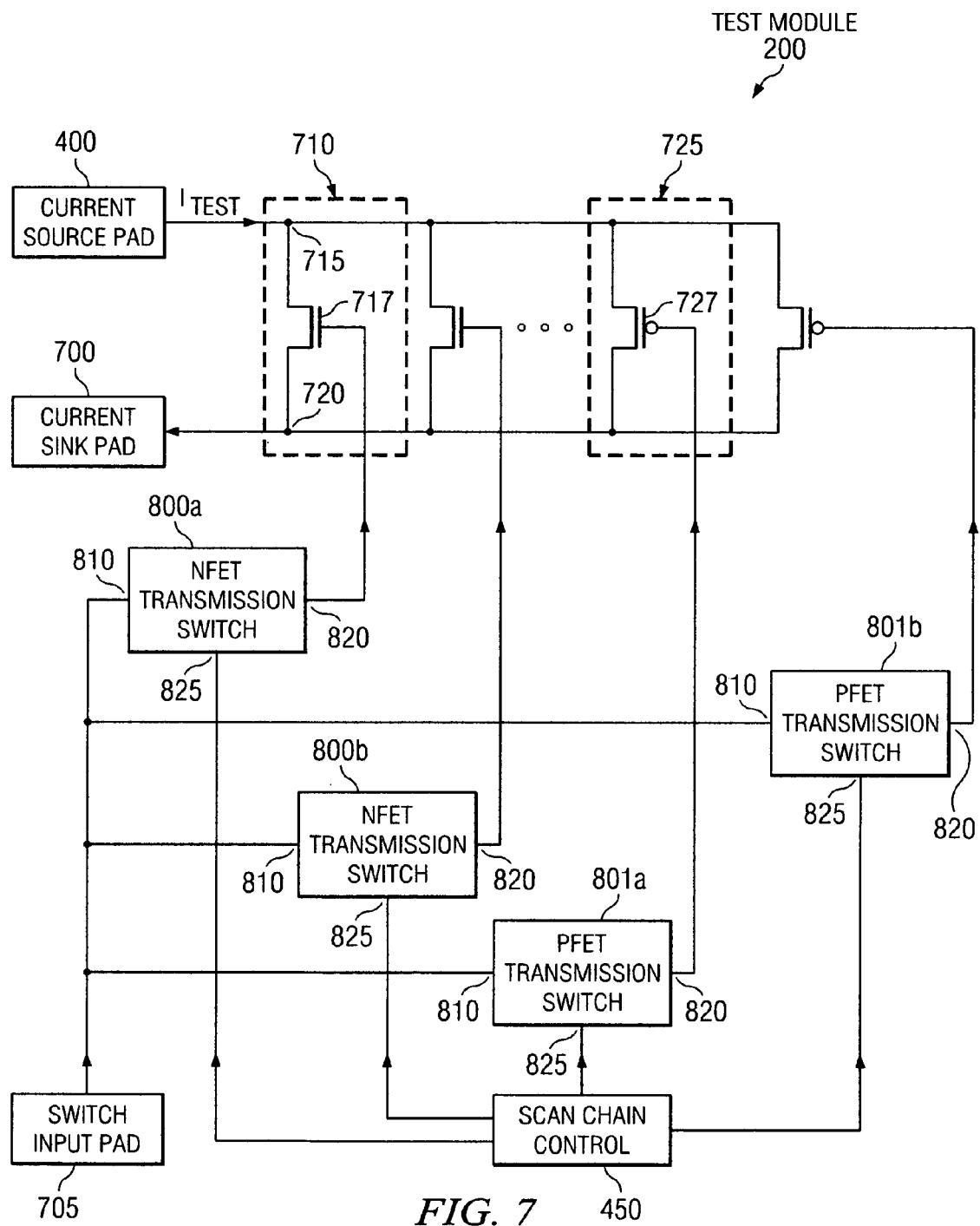
FIG. 7, in accordance with some embodiments of the invention, shows a test module capable of testing transistors.

Turning now to FIG. 7, test module 200, in accordance with some other embodiments of the invention, may contain a plurality of transistors coupled between a current source pad 400 and a current sink pad 700. The transistors may be a collection of PFETs, such as PFET 725, a collection of NFETs, such as NFET 710, a collection of PFETs and NFETs, or other types of transistors. Each transistor consists of a source connection, gate connection, and drain connection. For NFET 710, current may flow from drain connection 715 to source connection 720 when an appropriate voltage is applied to gate connection 717. The remaining transistors shown in FIG. 7, such as PFET 725, operate similarly.

The drain connection of each transistor couples to current source pad 400, and the source connection of each transistor connects to current sink pad 700. The gate connection of each transistor couples to a corresponding transmission switch. The transmission switches shown in FIG. 7 are described below and shown in FIG. 8. NFET transmission switch 800a, NFET transmission switch 800b, PFET transmission switch 801a, and PFET transmission switch 801 couple to a switch input pad 705.

Current source pad 400, current sink pad 700, and switch input pad 705 are conductive contacts capable of interfacing with an external testing device, such as a probe device. A voltage source may connect to switch input pad 705 through the external testing device. Further, a scan chain control 450 couples to each transmission switch. As described above, scan chain control 450 is capable of sequentially activating each transmission switch and may be similar to scan chain control 450 detailed in FIG. 5.

The external testing device sends a test current to current source pad 400. When scan chain control 450 closes NFET transmission switch 800a, switch input pad 705 connects to gate 717 of NFET 710 and applies a voltage to gate 717. The voltage applied to gate 717 through switch input pad 705 may be varied, thus varying the amount of test current allowed to flow from current source pad 400 to current sink pad 700 through NFET 710. By observing the varying voltages and currents at the current source pad, current sink pad, and switch input pad, test module 200 may determine the current-voltage relationship for each transistor. Thus, the current-voltage relationship may be analyzed and transistors with undesirable current-voltage relationships may be identified.

In accordance with some embodiments of the invention, test module 200 shown in FIG. 7 may contain more or less than four transistors. The number of transmission switches corresponds to the number of transistors coupled between current source pad 400 and current sink pad 700.

Figure 8A:
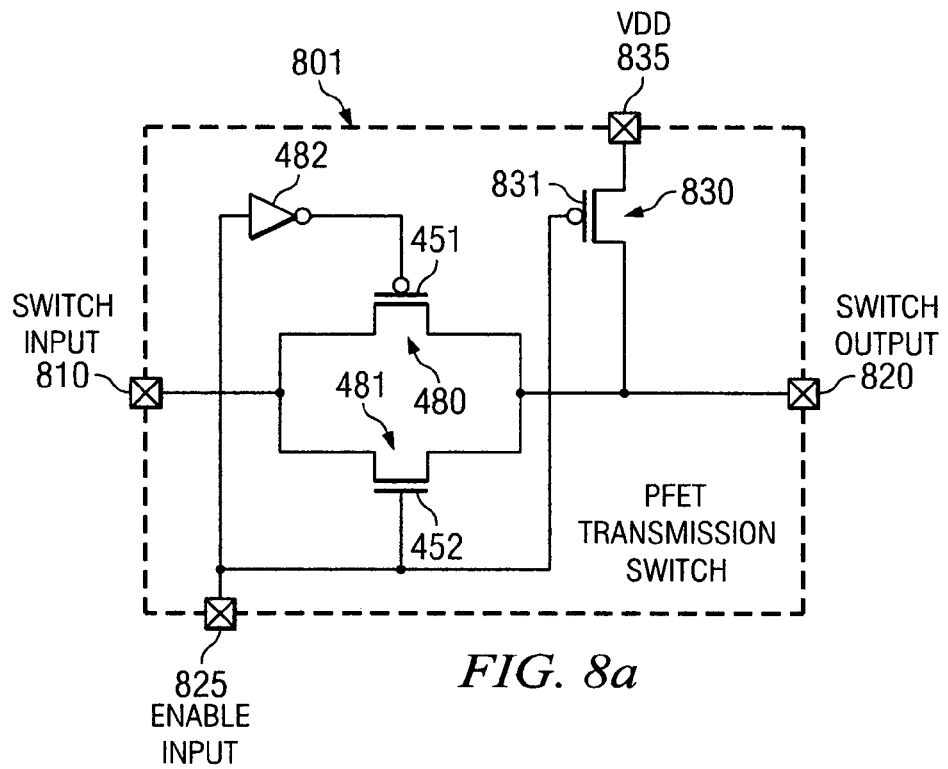
FIG. 8a, in accordance with some embodiments of the invention, shows a PFET transmission switch for use in testing PFETs.
Figure 8B:
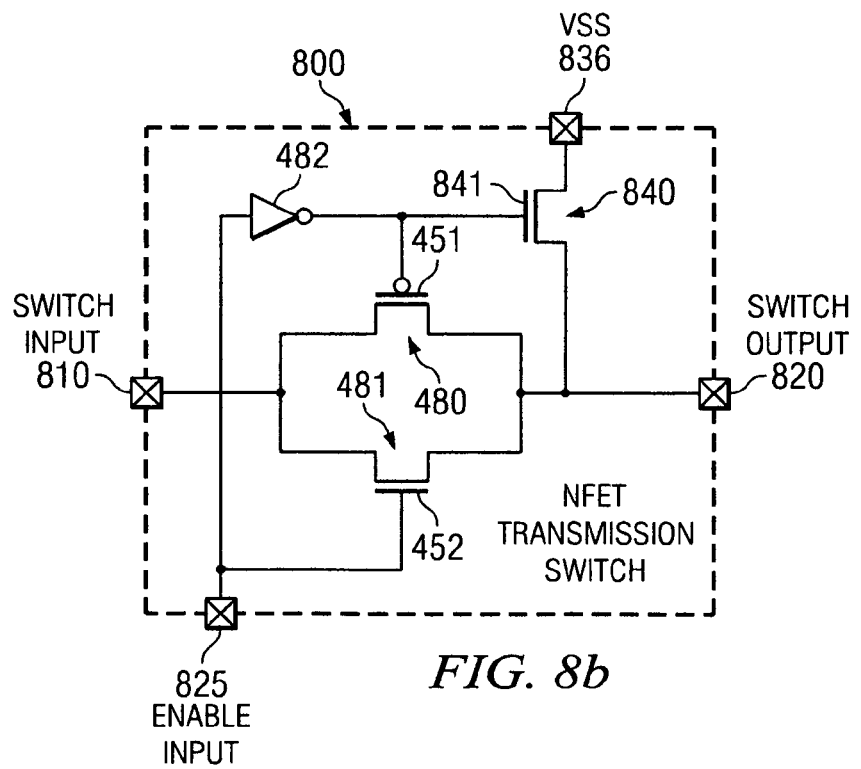
FIG. 8b, in accordance with some embodiments of the invention, shows an NFET transmission switch for use in testing NFETs.

Turning now to FIGS. 8a and 8b, PFET transmission switch 801 and NFET transmission switch 800 shown in FIG. 7 are illustrated in more detail. PFET transmission switch 801 represents PFET transmission switch 801a and 801b. NFET transmission switch 800 represents NFET transmission switch 800a and 800b. Both transmission switch 801 and 800 contain a PFET 480, NFET 481, and an inverter 482. PFET 480 functions as an open switch when a logical high is passed to gate connection 451 of the PFET 480. PFET 480 functions as a closed switch when a logical low is passed to the gate connection 451 of the PFET 480. Conversely, NFET 481 functions as an open switch when a logical low is passed to gate connection 452 of the NFET 481. NFET 481 functions as a closed switch when a logical high is passed to the gate connection 452 of the NFET 481. Inverter 482 provides an output that is the inverse of the input. Thus, if a logical high is passed to inverter 482, the inverter outputs a logical low and vice versa.

For the transmission switches shown in FIGS. 8a and 8b, the drain connection of PFET 480 connects to the drain connection of NFET 481 at switch input 810. As shown in FIG. 7, switch input 810 connects to switch input pad 705, which may connect to an external testing device that provides a voltage. The source connection of PFET 480 connects to the source connection of NFET 481 at switch output 820. Switch output 820 connects to the gate connection of a transistor, such as NFET 710 or PFET 725 in FIG. 7. An enable input 825 connects the gate connection of NFET 481 to scan chain control 450 shown in FIG. 7. Enable input 825 also connects to the gate connection of PFET 480 through inverter 482. Inverter 482 inverts the signal transmitted to the gate connection of PFET 480.

As shown in FIG. 8a for PFET transmission switch 801a and 801b, enable input 825 connects to gate connection 831 of a PFET 830. PFET 830 further connects switch output 820 to voltage VDD 835. VDD 835 represents a positive voltage corresponding to a logical high. Table 1 shows the switch output for different switch and enable inputs for PFET transmission switch 801.

TABLE 1

| Enable Input | Switch Input | VDD | Switch Output |
|---|---|---|---|
| 0 | 0 | 1 | 1 (strong) |
| 0 | 1 | 1 | 1 (strong) |
| 1 | 0 | 1 | 0 |
| 1 | 1 | 1 | 1 |

As shown in Table 1, when PFET transmission switch 801 receives a logical high (1) through enable input 825, PFET transmission switch 801 is closed and connects switch input 810 to switch output 820. When PFET transmission switch 801 receives a logical low (0) through enable input 825, PFET transmission switch 801 is opened and connects voltage VDD 835 to switch output 820. The strong logical high signal from switch output 820 ensures that a PFET is not activated in FIG. 7.

Returning to FIG. 7, PFET transmission switch 801a may thus connect switch input pad 705 to PFET 725 if a logical high is received by enable input 825 of PFET transmission switch 801a. PFET 725 may be activated if a logical low is transmitted from switch input pad to gate 727. Gate 727 of PFET 725 may be connected to voltage VDD 835 if a logical low is received by enable input 825 of PFET transmission switch 800a.

As shown in FIG. 8b for NFET transmission switch 800a and 800b, enable input 825 connects to gate connection 841 of an NFET 840 through inverter 482. NFET 840 further connects switch output 820 to voltage VSS 836. VSS 836 represents a negative voltage corresponding to a logical low. Table 2 shows the switch output for different switch and enable inputs for NFET transmission switch 800.

TABLE 2

| Enable Input | Switch Input | VSS | Switch Output |
|---|---|---|---|
| 0 | 0 | 0 | 0 (strong) |
| 0 | 1 | 0 | 0 (strong) |

TABLE 2-continued

| Enable Input | Switch Input | VSS | Switch Output |
|---|---|---|---|
| 1 | 0 | 0 | 0 |
| 1 | 1 | 0 | 1 |

As shown in Table 2, when NFET transmission switch 800 receives a logical low (0) through enable input 825, NFET transmission switch 800 is opened and connects switch output 820 to voltage VSS 836. The strong logical low signal sent from switch output 820 ensures that an NFET in FIG. 7 is not activated.

When NFET transmission switch 800 receives a logical high (1) through enable input 825, NFET transmission switch 800 is closed and connects switch input 810 to switch output 820. Returning to FIG. 7, NFET 710 may be activated if a logical high is transmitted from switch input pad to gate 717 of NFET 710.

Figure 9:
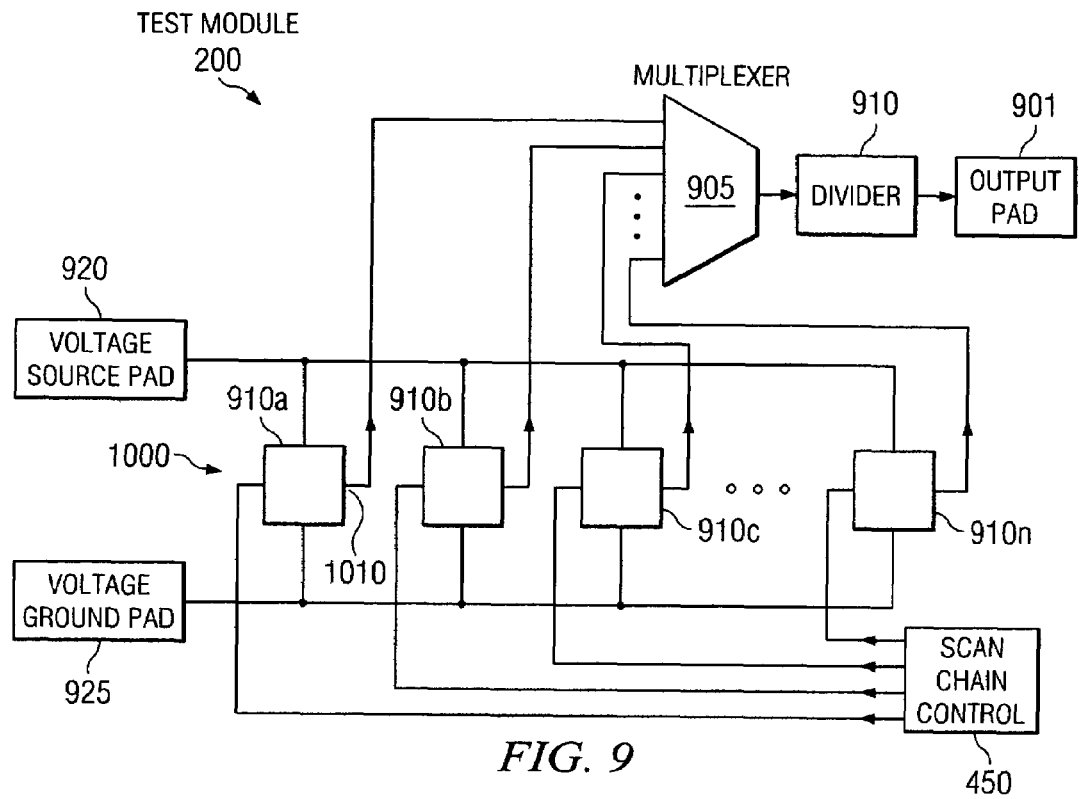
FIG. 9, in accordance with some embodiments of the invention, shows a test module capable of testing oscillators.
Figure 10:
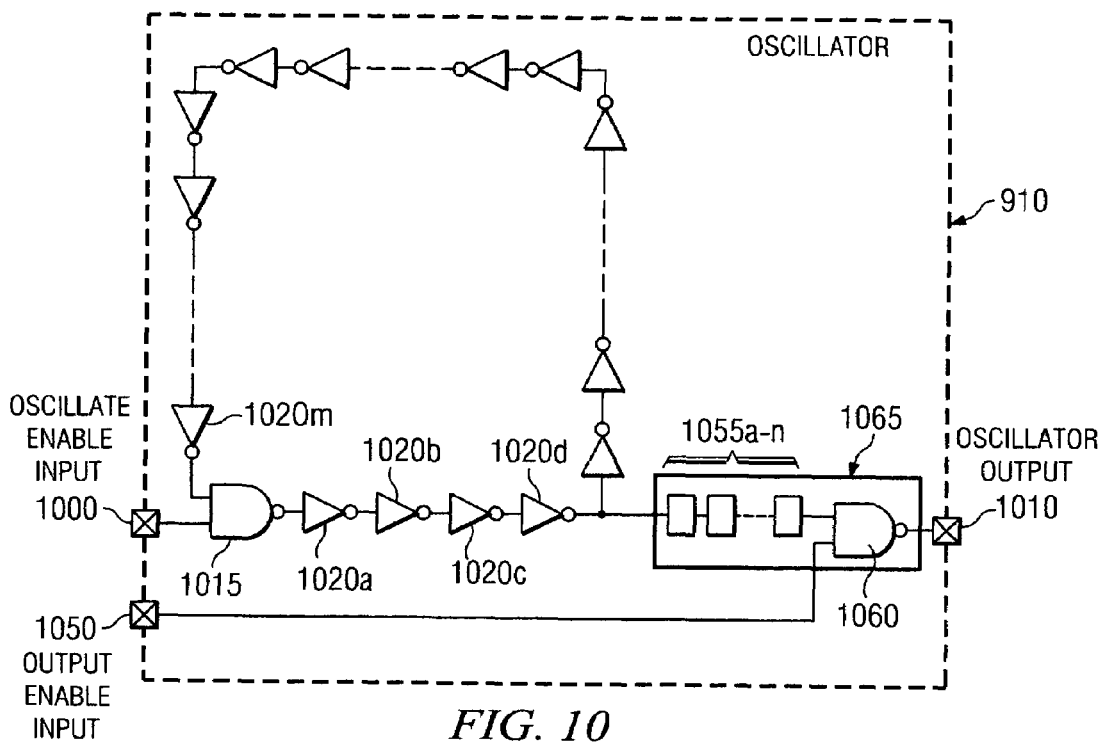
FIG. 10, in accordance with some embodiments of the invention, shows an oscillator including a number of logic gates.

Turning now to FIG. 9, test module 200 in accordance with some other embodiments of the invention is shown. Test module 200 contains a plurality of oscillators 910a . . . 910n coupled in parallel between a voltage source pad 920 and a voltage ground pad 925. An oscillator 910a in test module 200 is shown in more detail in FIG. 10. Oscillator 910a consists of an oscillator enable input 1000 connected to an oscillator output 1010 through a number of logic gates. Oscillator enable input 1000 couples to scan chain control 450 in FIG. 9. In some embodiments of the invention, oscillate enable input 1000 connects to a first input of a NAND gate 1015. The NAND gate connects to a string of inverters 1020a . . . 1020m, where the number of inverters is even. Each inverter 1020 provides an output that is the inverse of the input.

Inverter 1020d connects to pre-output divider 1065. Pre-output divider 1065 contains a string of dividers 1055a-1055n capable of reducing the frequency of inverter 1020d output signal. Pre-output divider 1065 outputs the resulting signal to oscillator output 1010 if output enable input 1050 is active. Divider 1065 contains a NAND gate 1060. NAND gate 1060 outputs inverter 1020d output to oscillator output 1010 if a logic high is received from an output enable input 1050.

Inverter 1020m connects to a second input of NAND gate 1015. Table 3 shows the NAND gate output for different inputs.

TABLE 3

| First Input | Second Input | NAND Gate Output |
|---|---|---|
| 0 | 0 | 1 |
| 0 | 1 | 1 |
| 1 | 0 | 1 |
| 1 | 1 | 0 |

As shown in Table 3, NAND gate 1015 outputs a one for every input combination except a logic high (1) for the first input and second input. In some other embodiments of the invention, the logic gates shown in FIG. 10 may be replaced with circuits arranged to provide a periodically varying output signal at oscillator output 1010.

Oscillator 910a is designed to periodically generate a square wave at oscillator output 1010. When scan chain control 450 sends a logic high to the first input 1000 of NAND gate 1015 and the second input of NAND gate 1015 receives a logic high from inverter 1020m, NAND gate 1015 outputs a logic low. Thus, oscillator 910 begins to oscillate, and oscillator output 1010 produces a periodically varying square wave if output enable input 1050 receives a logic high. In some embodiments of the invention, output enable input 1050 may also couple to scan chain control 450 and oscillate enable input 1000 (not shown in FIG. 10). Thus, oscillator output 1010 produces a periodically varying square wave if output enable input 1050 and oscillate enable input 1000 receive a logic high from scan chain control 450. Oscillator 910 ceases oscillation when output enable input 1050 and oscillate enable input 1000 receive a logic low from scan chain control 450.

Returning to FIG. 9, scan chain control 450, which is shown in FIG. 5, sequentially sends a logic high signal to each oscillator 910 through oscillate enable input 1000 and output enable input 1050. The oscillator output 1010 of each oscillator connects to a multiplexer 905. Thus, multiplexer 905 receives signals from each oscillator 910. Multiplexer 905 connects oscillators 910a . . . 910n to a divider 910 and further to an output pad 901. As described above, scan chain control 450 enables one oscillator 910 at a time. Oscillators 910 output a logic high from oscillator output 1010 when output enable input 1050 is not enabled. Multiplexer 905 may be configured to pass oscillating signals to divider 910. Divider 910 slows down the signal from the selected oscillator and passes the signal to output pad 901.

Voltage source pad 920, voltage ground pad 925, and output pad 901 are conductive contacts capable of interfacing with the external testing device. The external testing device may power logic gates in each oscillator through voltage source pad 920, and the external testing device may further provide a ground connection through voltage ground pad 925.

In some embodiments of the invention, the external testing device compares output received at output pad 901 from each oscillator 910a . . . 910n with an expected output for each oscillator. The external testing device may identify unreliable oscillators with incorrect outputs, incorrect frequency, and so on. In accordance with some embodiments of the invention, device test module 200 shown in FIG. 9 may contain more or less than four oscillators.

As described above, test modules 200 shown in FIGS. 4, 7, and 9 may test chains of vias, transistors, functional devices such as oscillators, or other integrated circuit components. The test modules and semiconductor test structures may be placed on scribe line 210 in FIG. 2, thus allowing components on semiconductor wafer 100 to be tested without taking up space on semiconductor die 110.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus, comprising:
   a source pad capable of sourcing a current;
   a sink pad capable of sinking a current;
   a plurality of components-under-test (CUT) disposed in a serial chain between the current source pad and the current sink pad, the serial chain including at least one intermediate node between adjacent CUT;
   a plurality of pass gates, each pass gate having a first terminal, a second terminal and a control terminal controlling whether the first and second terminal are electrically closed or electrically open, the first terminal of a first pass gate connected to the source pad, the first terminal of a last pass gate connected to the sink pad, the first terminal of each of at least one intermediate pass gate connected to a corresponding intermediate node;

an output pad connected to the second terminal of each of the plurality of pass gates; and a control coupled to the control terminal of each of the plurality of pass gates, wherein the control is capable of closing and opening the pass gates to allow determination of a voltage across each of the CUT.

2. The apparatus of claim 1, comprising:

a testing device coupled to the source pad, sink pad, and output pad, said testing device capable of providing a current to the source pad and a connection to ground to the sink pad, wherein the control sequentially closes and opens each pass gate and the testing device measures the voltage at each intermediate node via the corresponding pass gate and the output pad.

3. The apparatus of claim 1, comprising:

a semiconductor wafer;

a plurality of semiconductor dies on the wafer; and a plurality of scribe lines on the wafer, said scribe lines separating the semiconductor dies on the wafer, wherein each of the plurality of CUT are on one or more of the plurality of scribe lines.

4. The apparatus of claim 3, wherein the pass gates and control are on one or more of the plurality of scribe lines.

* * * * *